(12) United States Patent
Kim

(10) Patent No.: US 6,526,473 B1
(45) Date of Patent: Feb. 25, 2003

(54) MEMORY MODULE SYSTEM FOR CONTROLLING DATA INPUT AND OUTPUT BY CONNECTING SELECTED MEMORY MODULES TO A DATA LINE

(75) Inventor: Chi-wook Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/440,728

(22) Filed: Nov. 16, 1999

(30) Foreign Application Priority Data

Apr. 7, 1999 (KR) ............................................. 99-12027

(51) Int. Cl.[7] ............................................. G06F 12/02
(52) U.S. Cl. ............................. 711/105; 711/5; 711/111; 711/209; 365/230.03; 710/131
(58) Field of Search ............................. 711/5, 105, 111, 711/209; 365/230.03, 230.08; 710/131

(56) References Cited

U.S. PATENT DOCUMENTS

| | | | |
|---|---|---|---|
| 4,881,203 A | | 11/1989 | Watanabe et al. ............ 365/203 |
| 5,513,135 A | * | 4/1996 | Dell et al. ..................... 365/52 |
| 5,522,064 A | * | 5/1996 | Aldereguia et al. ......... 395/550 |
| 5,555,215 A | | 9/1996 | Nakagome et al. ......... 365/226 |
| 5,586,300 A | * | 12/1996 | Wilcox et al. ............... 395/477 |
| 5,715,211 A | | 2/1998 | Toda ........................... 365/233 |
| 5,802,395 A | | 9/1998 | Connolly et al. ............ 395/834 |
| 5,850,368 A | * | 12/1998 | Ong et al. ................. 365/238.5 |
| 5,940,328 A | * | 8/1999 | Iwamoto et al. ........ 365/189.01 |
| 5,953,215 A | * | 9/1999 | Karabatsos ................. 361/767 |
| 5,987,579 A | * | 11/1999 | Nishtala et al. ............. 711/169 |
| 6,070,217 A | * | 5/2000 | Connolly et al. ............ 710/131 |
| 6,098,132 A | * | 8/2000 | Olarig et al. ................ 710/103 |
| 6,161,165 A | * | 12/2000 | Solomon et al. ............ 711/114 |
| 6,209,074 B1 | * | 3/2001 | Dell et al. ................... 711/170 |
| 6,338,113 B1 | * | 1/2002 | Kubo et al. ................. 711/105 |

FOREIGN PATENT DOCUMENTS

| | | | |
|---|---|---|---|
| EP | 0090591 | 10/1983 | |
| EP | 0335715 | 10/1989 | |
| JP | 61145629 | 3/1986 | |
| WO | WO9941667 | 8/1999 | ..................... 711/5 |

OTHER PUBLICATIONS

Micron technology Inc., Synchronous DRAM (64Mb).*
Micron technology Inc., Synchronous DRAM (256Mb).*

* cited by examiner

Primary Examiner—Do Hyun Yoo
Assistant Examiner—Jasmine Song
(74) Attorney, Agent, or Firm—F. Chau & Associates, LLP

(57) ABSTRACT

A memory module system for connecting only selected memory modules to a data line to control data input and output is disclosed. The memory module system has a multiplicity of memory modules for outputting data to a data bus line, and more particularly, only the memory modules outputting data is electrically connected to the data bus line in response to activation of a predetermined connection control signal. The connection control signal has an activation width corresponding to a burst length of the output data. Only selected memory modules are connected to the data line during the data burst length, so that load per data pin is minimized, to thereby improve speed of writing and reading data.

27 Claims, 13 Drawing Sheets

MEMORY MODULE SYSTEM FOR CONTROLLING DATA INPUT AND OUTPUT BY CONNECTING SELECTED MEMORY MODULES TO A DATA LINE

BACKGROUND OF THE INVENTION

1. Field of the Invention

The present invention relates to a system with memory modules for controlling data input and output, and more particularly, to a system having a multiplicity of memory modules for controlling data input and output from and to a common data line by connecting selected memory modules to the common data line.

2. Description of the Related Art

A semiconductor memory device such as a dynamic random access memory (DRAM) can be used as a main memory in a system such as a computer. A memory using semiconductor memory devices generally has memory modules, such as dual in-line memory modules (DIMM) and single in-line memory modules (SIMM). A memory may be required to include a plurality of memory modules for operations of a system. In such a system, each of the memory modules uses a common data line. For instance, assuming that a main memory has a capacity of 32M bytes and is made with DIMMs each of which has a capacity of 8M bytes and made of four 16M (1M×16) DRAMs, the main memory of 32M bytes requires four slots, i.e., four DIMMs. Since the number of data bus lines is 64 and the number of data pins per DIMM is 64, the main memory of 32M bytes requires a multiplicity of data pins. Thus, four DIMMs constituting the main memory of 32M bytes use a common data bus line of a system. As the capacity of the main memory is increased, the necessity of using a common data line is increased.

The capacitance per data pin of a DIMM module is 20~25 pF. Thus, when the 32M byte memory is composed of four DIMMs of 1M×64, the capacitance per data pin becomes approximately 80~100 pF. Thus, the capacitance per data pin is so great that an increase in the load of an output driver increases power consumption, and that speed for writing and reading data is remarkably reduced.

SUMMARY OF THE INVENTION

It is an object of the present invention to provide a memory module with minimized load capacitance per data pin to improve speed of writing and reading data and of the memory module.

To achieve the above and other objects, according to an aspect of the present invention, there is provided a memory module system for controlling data output to a data bus line, the system comprising a multiplicity of memory modules each of which includes a control signal generation circuit for generating a connection control signal having a width of activation corresponding to a burst length of output data, wherein the control signal generation circuit has a read control unit for activating input data during output of data of a predetermined burst length in a read mode to generate a read control signal, the read control unit receiving CAS latency information, a read command signal and burst length information of read data, and a multiplicity of switching units for electrically connecting output terminals of the memory modules to the data bus line in response to activation of the connection control signal. In the memory module system according to the present invention, the memory modules for receiving outputting data are electrically connected to the data bus line in response to activation of the connection control signals. The control signal generation circuit further comprises a write information generation unit. The write information generation unit receives a write command signal and burst length information of write data, and it is activated in a write mode during inputting data of a predetermined burst length to generate a write control signal.

In a memory module system for controlling data input and output according to the present invention, selected memory modules are connected to a data line during a data burst length in which data is input and output. Thus, load is minimized per data pin, so that speed of writing and reading data is improved.

BRIEF DESCRIPTION OF THE DRAWINGS

The above and other objects and advantages of the present invention will become more apparent by describing in detail a preferred embodiment thereof with reference to the attached drawings in which.

DESCRIPTION OF PREFERRED EMBODIMENTS

Figure 1:
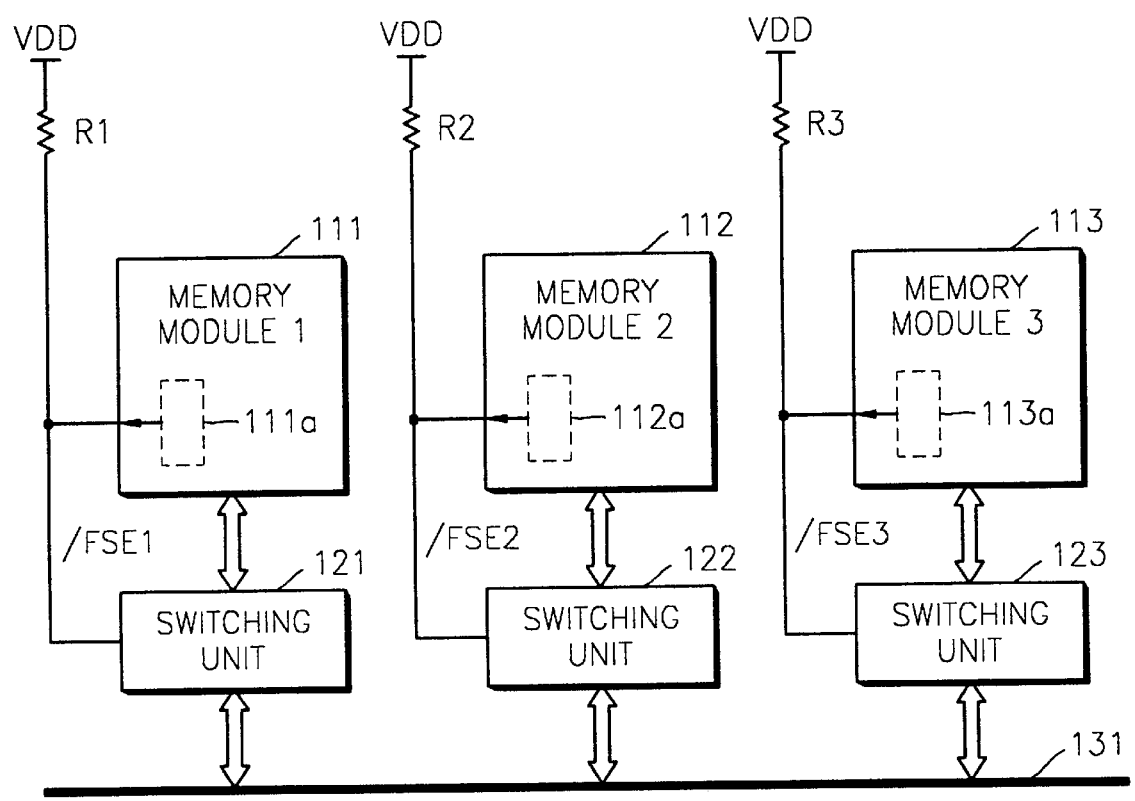
FIG. 1 is a block diagram schematically showing a system having a multiplicity of memory modules according to a first embodiment of the present invention.

Referring to FIG. 1, a first embodiment of a memory module system according to the present invention has a multiplicity of memory modules. For convenience, three memory modules, i.e., first through third memory modules 111, 112 and 113, are shown. The first through third memory modules 111, 112 and 113 are selected, so that output data is transferred to a common data bus line 131 through switching units 121, 122 and 123.

Each of the switching units includes switches, through which data is output from a corresponding memory module.

Also, the data output through the switches is transferred to the data line bus 131. Each of the switching units 121, 122 and 123 is turned on when data is input to and output from the corresponding memory module. However, when data is not input to or output from the corresponding memory module, each of the switching units 121, 122 and 123 is turned off. For instance, assuming that the first memory module 111 is selected, to input or output data to or from the first memory module 111, a first connection control signal /FSE1 is activated to logic "low", so that the first switching unit 121 is turned on. Thus, output data of the first memory module 111 is transferred to the data bus line 131 through the first switching unit 121. At this time, second and third connection control signals /FSE2 and /FSE3 are deactivated to logic "high" by an external power supply voltage VDD applied through resistors R2 and R3, respectively. The resistors R2 and R3 may be external to the memory modules 112 and 113.

In detail, the resistors R1 to R3 have relatively high resistances. Thus, voltage levels of the first through third connection control signals /FSE1, /FSE2 and /FSE3 are determined by the first through third memory modules 111, 112 and 113, respectively. However, when signals to determine the voltage levels of the connection control signals /FSE1, /FSE2 and /FSE3 in the respective memory modules are in floating state, the voltage levels of the first through third connection control signals /FSE1, /FSE2 and /FSE3 become an external power supply voltage VDD, i.e., logic "high", applied through the resistors R1 to R3 connected to the respective memory modules. That is, when the first memory module 111 is selected, the second and the third connection control signals /FSE2 and /FSE3 become logic "high". The second and the third connection control signals /FSE2 and /FSE3 deactivated to the "high" then turn off the second and the third switching units 122, 123. Thus, load of data pins of the second and third memory modules 112 and 113 is separated from the data bus line 131. In other words, memory modules other than the selected memory module are separated from the data line 131, to thereby reduce load of the data bus line 131.

Preferably, each of the first through third connection control signals /FSE1, /FSE2 and /FSE3 is generated by the corresponding memory modules 111, 112 and 113. Control signal generation circuits 111*a*, 112*a* and 113*a* which are included in the corresponding memory modules 111, 112 and 113 generate the first through third connection control signals /FSE1, /FSE2 and /FSE3, respectively. Also, activation intervals of the first through third connection control signals /FSE1, /FSE2 and /FSE3 are preferably determined by burst lengths of input or output data. Also, the first through third connection control signals /FSE1, /FSE2 and /FSE3 may be provided from a control unit (not shown) which transfers the input data from the outside of the memory modules.

Figure 2:
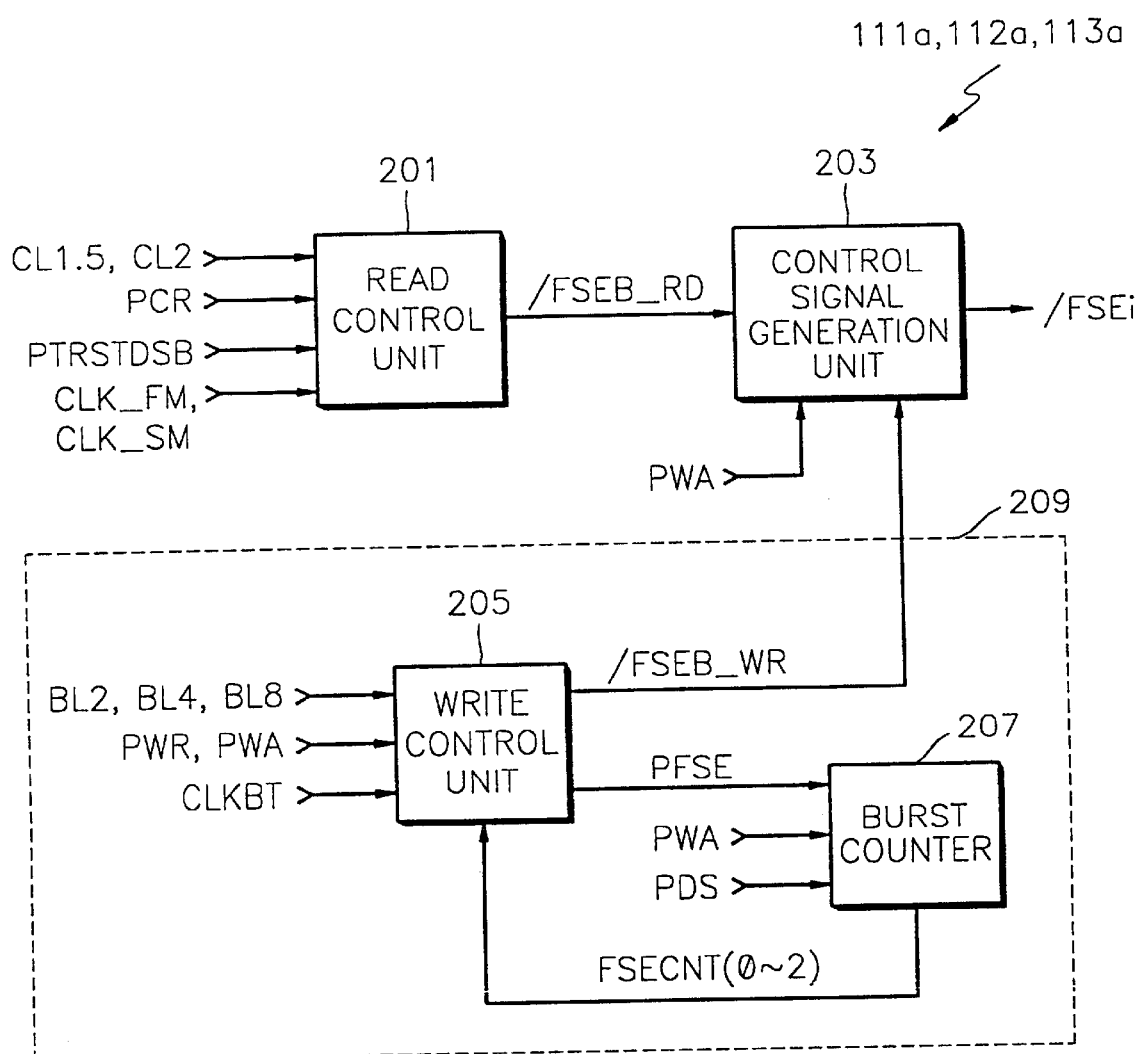
FIG. 2 is a block diagram of one of the control signal generation circuits of FIG. 1.

FIG. 2 is a block diagram illustrating a preferred embodiment of a control signal generation circuit according to the present invention. As described above, the control signal generation circuits 111*a*, 112*a* and 113*a* each having the same configuration as in FIG. 2 are included in the memory modules 111, 112 and 113, respectively. For convenience, the first through third connection control signals /FSE1, /FSE2 and /FSE3 are indicated by /FSEi.

Referring to FIG. 2, the control signal generation circuit includes a read control unit 201, a control signal generation unit 203, a write control unit 205 and a burst counter 207. The read control unit 201 receives column address strobe (CAS) latency signals CL1.5 and CL2, a read command signal PCR and a read strobe signal PTRSTDSB, and generates a read control signal /FSEB_RD. The CAS latency signals CL1.5 and CL2 include /CAS latency information, and the read command signal PCR introduces a read command for a read mode. The read strobe signal PTRSTDSB includes information on a burst length of read data, for example, information on burst signals BL2, BL4 and BL8 input to the write control unit 205. Also, the read control signal /FSEB_RD is activated in response to the burst length of the read data in the read mode. The read control unit 201 will be described in detail with reference to FIG. 3.

The control signal generation unit 203 supplies the connection control signal /FSEi in response to the read control signal /FSEB_RD and a write control signal /FSEB_WR. The write control signal /FSEB_WR supplied by the write control unit 205, is activated for an interval corresponding to a burst length of data input in a write mode. Thus, the connection control signal /FSEi is activated in response to the read control signal /FSEB_RD in the read mode, and also activated in response to the write control signal /FSEB_WR in the write mode. The control signal generation unit 203 will be described in detail, with reference to FIG. 4.

The write control unit 205 receives burst signals BL2, BL4 and BL8 and first and second write command signals PWA and PWR, and generates a write control signal /FSEB_WR and a counter control signal PFSE. Here, the burst signals BL2, BL4 and BL8 include information on burst lengths of data in a write mode. The first write command signal PWA is a pulse indicating that a memory module enters into a write mode, in response to a write command. The second write command signal PWR indicates that a memory module is in a write mode.

The write control signal /FSEB_WR which is activated for an interval corresponding to the data burst length in which data is input in the write mode, is supplied to the control signal generation unit 203. Also, the counter control signal PFSE which is supplied to the burst counter 207, is activated in response to an inverted clock signal CLKBT which is firstly generated after generating the write command signal, and deactivated after receiving a predetermined number of data. The inverted clock signal CLKBT is an inverted signal of an external clock signal CLK (not shown). The write control unit 205 will be described in detail with reference to FIG. 11.

The burst counter 207 is enabled in response to the activation of the counter control signal PFSE. The burst counter 207 receives a first write command signal PWA and a data strobe signal PDS, and counts the number of input data. Also, a counting signal FSECNTi (where, i=0 to 2) indicating the number of input data is supplied to the write control unit 205. The data strobe signal PDS indicating an input of data, is formed by an external data strobe signal of a memory module. The data strobe signal PDS indicates an input or output of one of the data by one transition in a double data rate (DDR). The memory module system of the present invention will be described in the DDR mode. The number of input data can be indicated by a combination of the counting signals FSECNTi, where i=0 to 2. The burst counter 207 will be described in detail with reference to FIG. 8.

A control signal generation circuit which generates the connection control signal /FSEi can be realized with the read control unit 201 and the control signal generation unit 203 of FIG. 2 in a read mode. A write information generation unit 209 for activating the write control signal /FSEB_WR for an interval corresponding to the burst length of data input may be realized in a write mode with the write control unit 205 and the burst counter 207. Thus, the control signal generation circuit for generating the connection control signal /FSEi may be realized in the write mode with the write information generation unit 209 and the control signal generation unit 203 of FIG. 2.

Figure 3:
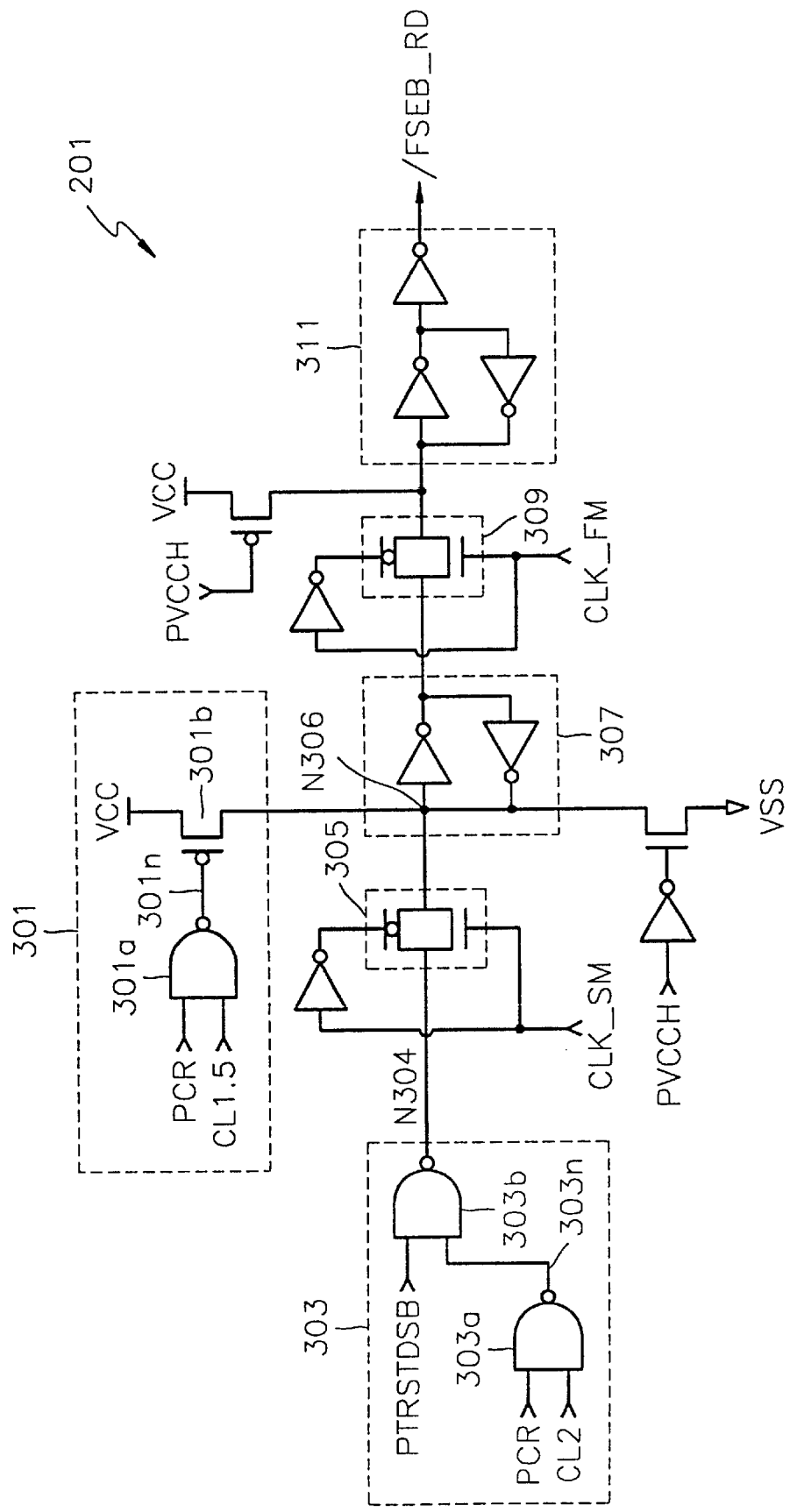
FIG. 3 is a circuit diagram of the read control unit of FIG. 2.

FIG. 3 is a circuit diagram of a preferred embodiment of the read control unit 201 in FIG. 2. Referring to FIG. 3, the read control unit 201 includes a first latency response unit 301, a second latency response unit 303, a first transfer unit 309, a first latch unit 307, a second transfer unit 305 and a second latch unit 311.

The first latency response unit 301 is enabled in response to a CAS latency shorter than a predetermined latency. According to a preferred embodiment of the present invention, the first latency response unit 301 is enabled, when the CAS latency is 1.5. The first latency response unit 301 includes a logic gate 301a and a drive transistor 301b. The logic gate 301a is enabled by activation of CL1.5 indicating the CAS latency of 1.5, and responds to a read command signal PCR. The read command signal PCR is activated in response to a first clock signal from generation of a read command, and. is maintained in the activated state during a period of one clock. The drive transistor 301b is gated by an output signal 301n of the logic gate 301a. Thus, the transistor 301b outputs an output signal to the first latch unit 307 in response to activation of the read command signal PCR. Preferably, the logic gate 301a is a NAND gate, and the transistor 301b is a PMOS transistor.

When the CAS latency is two or more, the second latency response unit 303 is enabled. An output signal N304 of the second latency response unit 303 maintains a logic "high" state by activation of a read strobe signal PTRSTDSB. The second latency response unit 303 includes logic gates 303a and 303b. The logic gate 303a is enabled by activation of CL2 indicating the CAS latency of 2, and responds to the read command signal PCR. Also, the logic gate 303b is enabled by the output signal 303n of the logic gate 303a, and responds to the read strobe signal PTRSTDSB. Preferably, the logic gates 303a and 303b are NAND gates. The second transfer unit 305 transfers the output signal N304 of the second latency response unit 303 in response to a first clock signal CLK_SM.

The first latch unit 307 latches either the output signal of the first latency response unit 301 or the output signal N304 of the second latency response unit 303 transferred by the second transfer unit 305. The first transfer unit 309 transfers signals latched by the first latch unit 307 in response to a second clock signal CLK_FM. The second latch unit 311 latches a signal N306 transferred by the first transfer unit 309, and outputs the latched signal as a read control signal /FSEB_RD.

Figure 5:
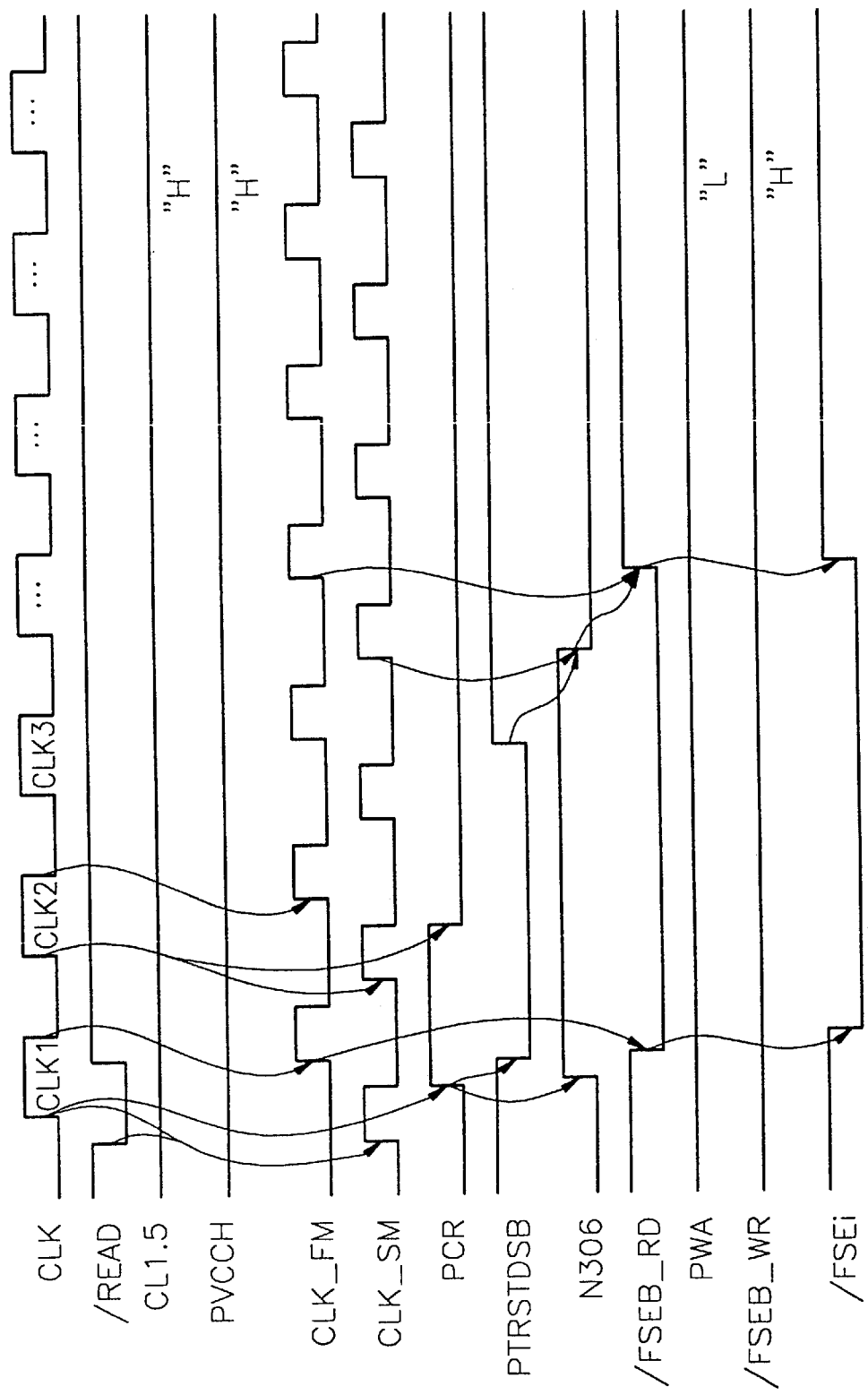
FIGS. 5 through 7 are timing diagrams of control and data signals in FIGS. 3 and 4 in a read mode having CAS latencies of 1.5, 2 and 2.5, respectively.
Figure 6:
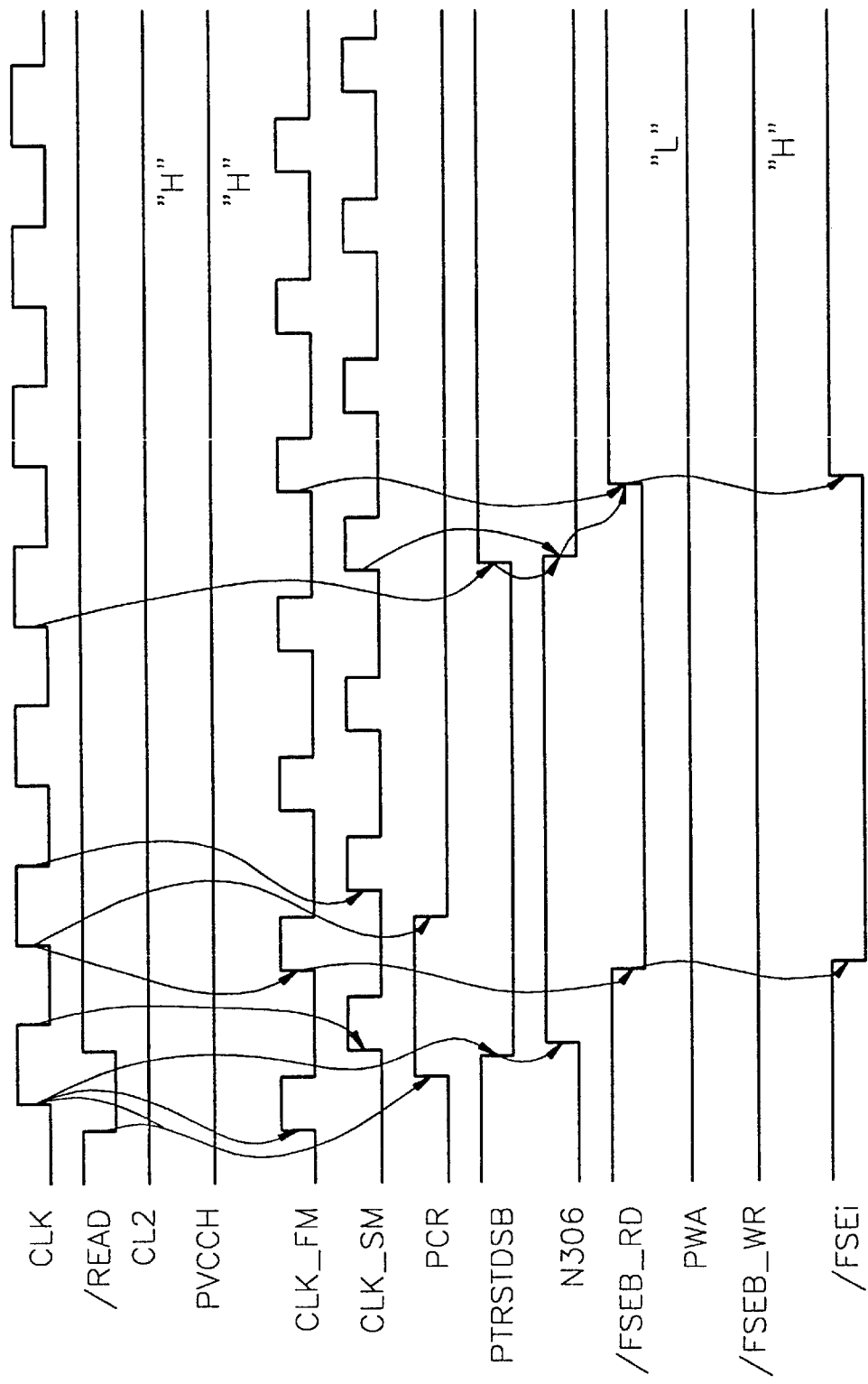
Figure 7:
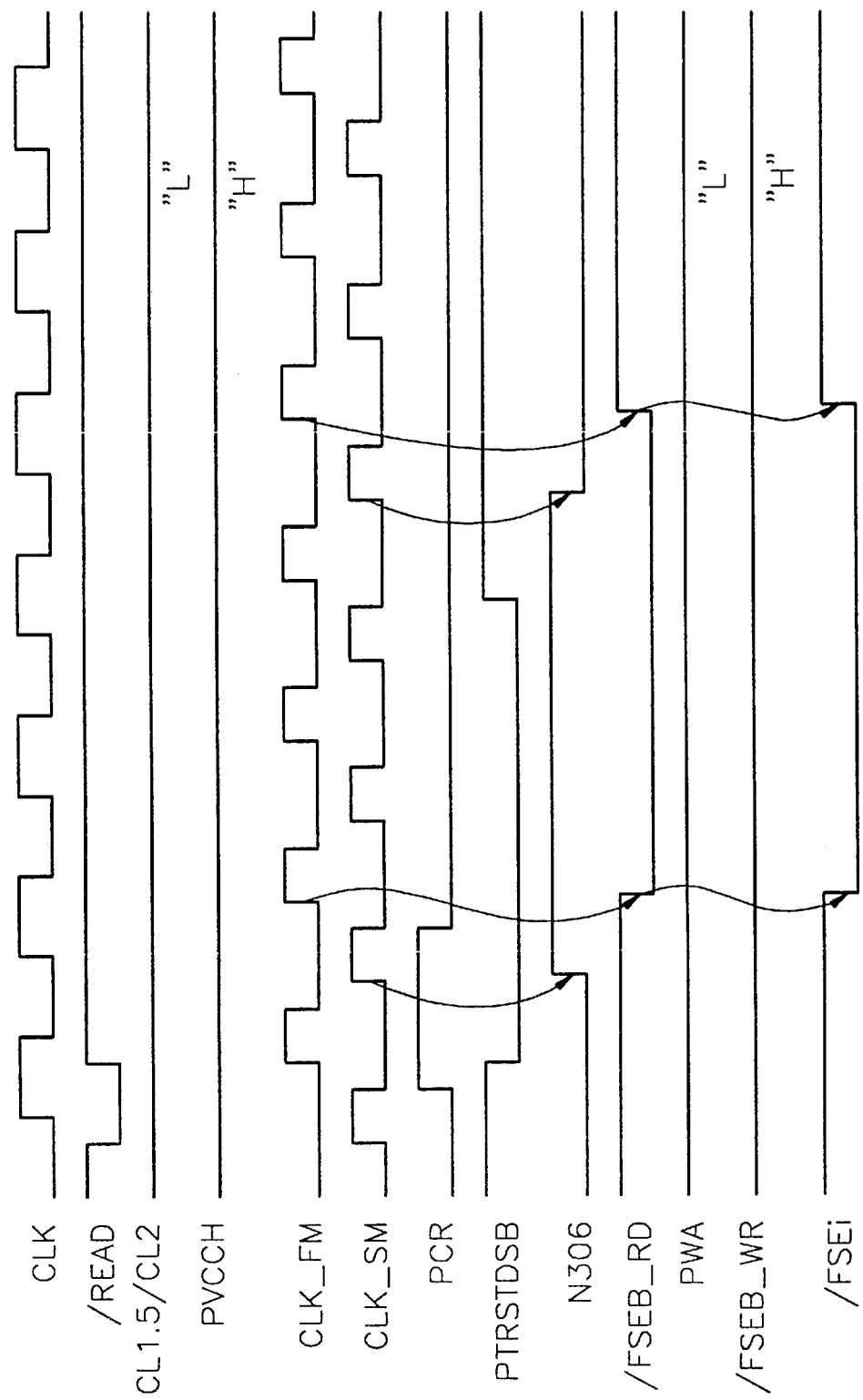

Here, the first and the second clock signals CLK_SM and CLK_FM are pulse signals generated in response to rising and falling transitions of the external clock signal CLK. The first and the second clock signals CLK_SM and CLK_FM which control data output timing, have timing with respect to the external clock signal CLK as shown in FIGS. 5 through 7.

Figure 4:
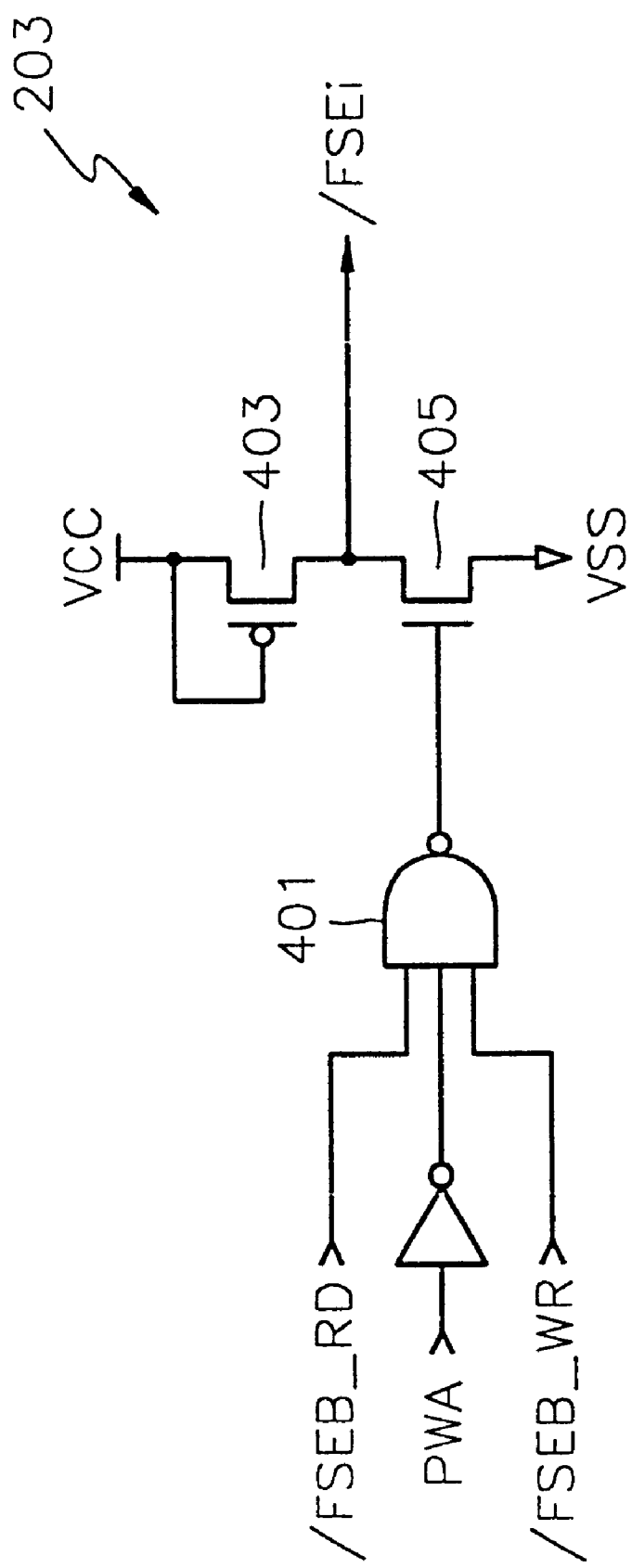
FIG. 4 is a circuit diagram of the control signal generation unit of FIG. 2.

FIG. 4 is a circuit diagram illustrating a preferred embodiment of the control signal generation unit 203 of FIG. 2. Referring to FIG. 4, the control signal generation unit 203 includes a NAND gate 401, a PMOS transistor 403 and an NMOS transistor 405. The NAND gate 401 receives an inverted signal of the read control signal /FSEB_RD, an inverted signal of the write control signal /FSEB_WR and the first write command signal PWA. That is, the NAND gate 401 is enabled by the first write command signal PWA, and acts as a logic gate responding to the read control signal /FSEB_RD or the write control signal /FSEB_WR.

The NMOS transistor 405 is gated by an output signal of the NAND gate 401. Thus, the NMOS transistor 405 acts for driving connection control signal in response to the read control signal /FSEB_RD or the write control signal /FSEB_WR.

The PMOS transistor 403 has source and gate terminals which are in common connected. A drain terminal of the PMOS transistor 403 and a drain terminal of the NMOS transistor 405 are in common connected to generate the connection control signal /FSEi.

In a precharge state, the read control signal /FSEB_RD and the write control signal /FSEB_WR are both logic "high" and the first write command signal PWA is logic low. Thus, the output signal of the NAND gate 401 becomes low and the NMOS transistor 405 is turned off. The connection control signal /FSEi becomes logic "high" in response to an external power supply voltage VDD applied through a resistor outside a memory module.

An embodiment of a control signal generation circuit for generating a connection control signal can be realized with the read control unit 201 in FIG. 3 and the control signal generation unit 203 in FIG. 4 in a read mode.

FIGS. 5 through 7 are timing diagrams of control signals and data signals in FIGS. 3 and 4 in a read mode in which CAS latencies are 1.5, 2, and 2.5, respectively. Assuming that a data burst length is 4, and the memory modules operate in a DDR mode, the operation of the read control unit 201 when the CAS latency is 1.5, will FIG. 5 be described with reference to FIGS. 3, 4 and 5.

Referring to FIG. 5, a logic state of the CAS latency signal CL1.5 is high, and a logic state of the CAS latency signal CL2 is low. Activation of /READ signal to low state indicates a generation of a read command. The read command signal PCR is activated for one clock period in response to a rising edge of the first clock pulse CLK1 after the generation of the read command. Thus, the output signal N306 of the first latency response unit 301 becomes logic "high" in response to the read command signal PCR, and is latched to high by the first latch unit 307. That is, when the read command is generated, the output signal N306 of the first latency response unit 301 is latched to high by the first latch unit 307, regardless of a level of the clock signal.

The read strobe signal PTRSTDSB is activated to logic "low" in response to activation of the read command signal, and is activated to logic "high" after a period of time corresponding to the data burst length. The output signal N304 of the second latency response unit 303 is transferred to the first latch unit 307 by the second transfer unit 305 turned on in response to the first clock signal CLK_SM. Thus, when the read strobe signal PTRSTDSB is activated to logic "low", the input signal at the terminal N306 of the first latch unit 307 is maintained at logic "high" even when the read command signal PCR is deactivated to logic "low".

Data latched by the first latch unit 307 is transferred to the second latch unit 311 by the first transfer unit 309 turned on in response to the second clock signal CLK_FM. The output signal of the second latch unit 311 is connected to an output terminal of the read control signal /FSEB_RD. Thus, the read control signal /FSEB_RD is activated to logic "low" in response to the generation of the read command, and then deactivated to high in a period of time corresponding to the burst length. That is, a time period of the activation of the read control signal /FSEB_RD corresponds to that of the burst length.

In a read mode, the first write command signal PWA is maintained at logic "low", and the write control signal /FSEB_WR is maintained at logic "high". Thus, in the read mode, activation of the connection control signal /FSEi depends on activation of the read control signal /FSEB_RD.

In a preferred embodiment of the present invention, when the CAS latency is 1.5, the input signal N306 of the first latch unit 307 is activated regardless of the clock signal, and the activation is maintained by the read strobe signal PTRSTDSB. When the read control signal /FSEB_RD is activated in response to the first clock signal CLK_SM, the connection control signal /FSEi is not activated until a first data burst is read, despite of the CAS latency of 1.5.

The operation of the read control unit 201 with the CAS latency of 2 will now be described, with reference to FIGS. 3, 4 and 6. A logic state of the CAS latency signal CL2 is high, and a logic state of the CAS latency signal CL1.5 is low. Thus, the output signal N306 of the first latency response unit 301 does not respond to the read command signal PCR.

The output signal N304 of the second latency response unit 303 is activated to high in response to an activation of the read command signal PCR, and is transferred to the first latency unit 307 in response to an activation of the first clock signal CLK_SM. The logic state of the input signal N306 of the first latch unit 307 is maintained at high in response to activations of both the read strobe signal PTRSTDSB and the first clock signal CLK_SM.

Thus, the read control signal /FSEB_RD, similar to the case of the CAS latency of 1.5, is activated to low in response to a generation of the read command, and deactivated to high after a period corresponding to the burst length. That is, the read control signal /FSEB_RD is activated for an interval corresponding to the burst length.

The operation of the read control unit 201 when the CAS latency is 2 or more, i.e., the logic states of the CAS latency signals CL1.5 and CL2 are low, will now be described with reference to FIGS. 3, 4 and 7. The output signal N304 of the second latency response unit 303 becomes high after the read strobe signal PTRSTDSB is activated to low. The output signal N304 of the second latency response unit 303 is transferred to the first latch unit 307 in response to activation of the first clock signal CLK_SM. When the read strobe signal PTRSTDSB is deactivated to high, the input signal N306 of the first latch unit 307 becomes low. Thus, the read control signal /FSEB_RD is activated or deactivated by the read strobe signal PTRSTDSB, unlike the case in which the CAS latency is 1.5 or 2.

As described above, the control signal generation circuit according to a preferred embodiment of the present invention generates a connection control signal activated in response to the data burst length in which data is read from a memory module in a read mode. Also, only the memory module selected by the connection control signal is connected to a data line during the data burst length in which data is output.

Figure 8:
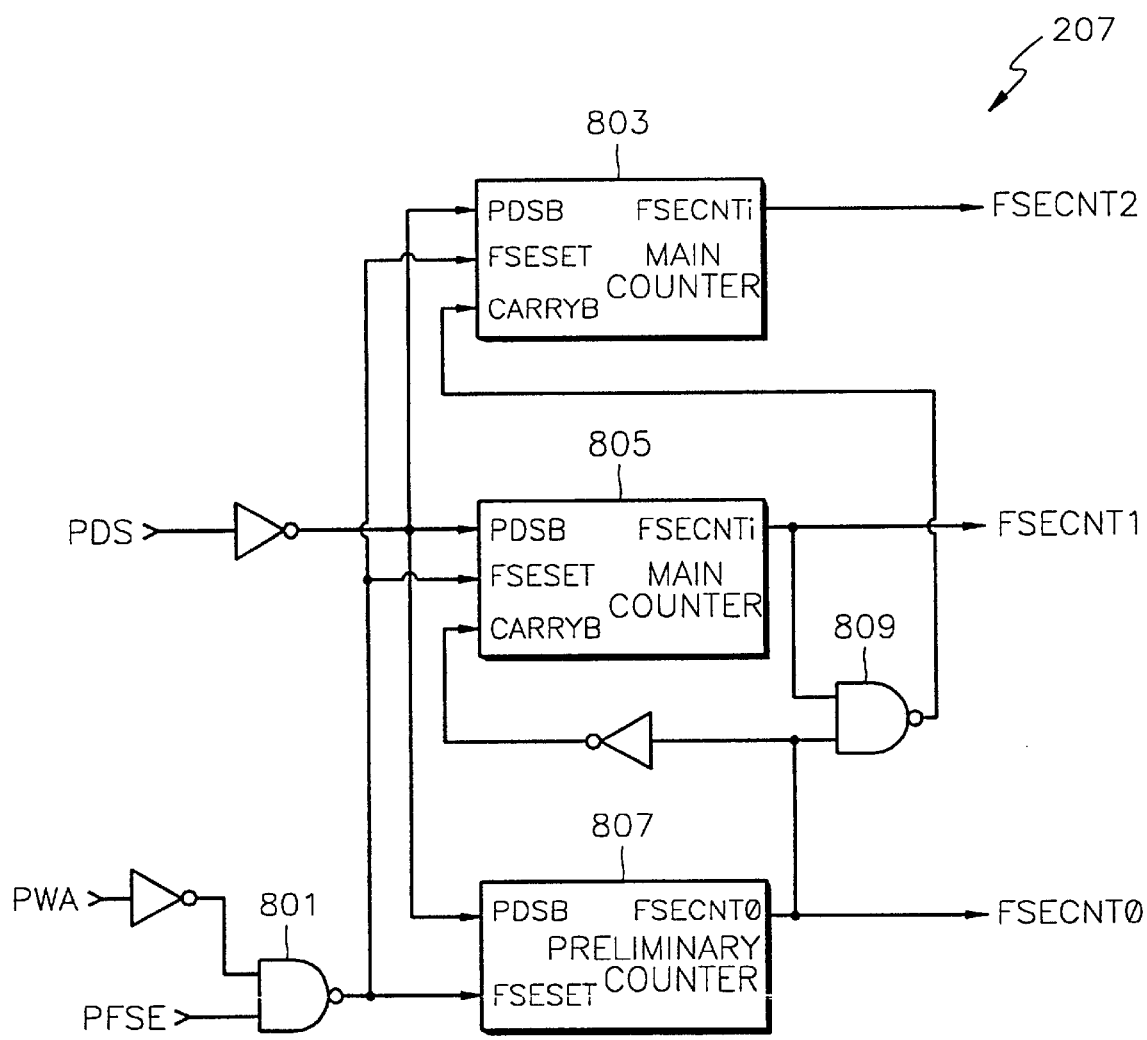
FIG. 8 is a circuit diagram of the burst counter of FIG. 2.

FIG. 8 is a circuit diagram illustrating an embodiment of the burst counter 207 of FIG. 2. In FIG. 8, a burst counter capable of counting eight data bursts is shown. The burst counter 207 shown in FIG. 8 includes one preliminary counter 807 and two main counters 803 and 805. The preliminary counter 807 and the main counters 803 and 805 are reset by activation of a counter control signal PFSE. That is, when a write command is generated so that the counter control signal PFSE is activated to high, the preliminary counter 807 and the main counters 803 and 805 are reset. Output signals of the preliminary counter 807 and the main counters 803 and 805, i.e., first through third counting signals FSECNT0~2 are reset to low.

As described above, a data strobe signal PDS indicates inputs of external data during rising and falling transitions in a DDR mode. Structure and operation of the burst counter 207 in a DDR mode will now be described.

In an embodiment of the present invention, data is input during rising and falling edges of the data strobe signal PDS, and the data is continuously input when a phase transition of the data strobe signal PDS is repeated. The first counting signal FSECNT0 performs the phase transition at every falling edge of the input data strobe signal. Also, when carries CARRYBs of the main counters 803 and 805 are activated to low, the second and the third counting signals FSECNT1~2 repeat the phase transition every two inputs of data.

Referring to FIG. 8, the carry CARRYB of the main counter 805 is activated to low, when the first counting signal FSECNT0 is activated to high. The carry CARRYB of the main counter 803 is activated to low, when the first and the second counting signals FSECNT0~1 are high.

Figure 9:
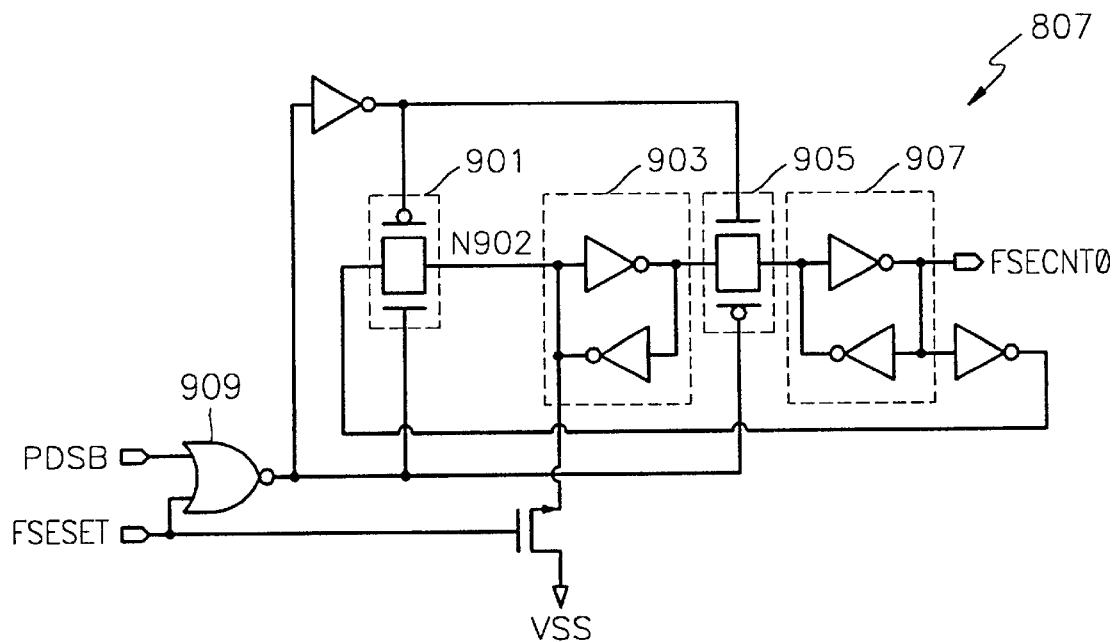
FIG. 9 is a circuit diagram of the preliminary counter of FIG. 8.

The preliminary counter 807 and the main counters 803 and 805 of FIG. 8 will now be described with reference to FIGS. 9 and 10, respectively. FIG. 9 is a detailed circuit diagram illustrating an embodiment of the preliminary counter 807 of FIG. 8. Referring to FIG. 9, the preliminary counter 807 includes first and second transfer units 901 and 905, first and second latch units 903 and 907, and a NOR gate 909. The NOR gate 909 performs an OR operation on a reset signal FSESET and an inverted signal PDSB of the data strobe signal PDS and inverts the OR-operated signals. The reset signal FSESET is connected to the counter control signal PFSE. Thus, when the reset signal FSESET is disabled to low, the preliminary counter 807 is enabled to respond to the phase transition of the inverted signal PDSB. That is, when a phase of the inverted signal PDSB is transited from high to low, the first transfer unit 901 is turned on. When the phase of the inverted signal PDSB is transited from low to high, the second transfer unit 905 is turned on. Whenever the inverted signal PDSB is deactivated, the first counting signal FSECNT0 repeats the phase transition.

Figure 10:
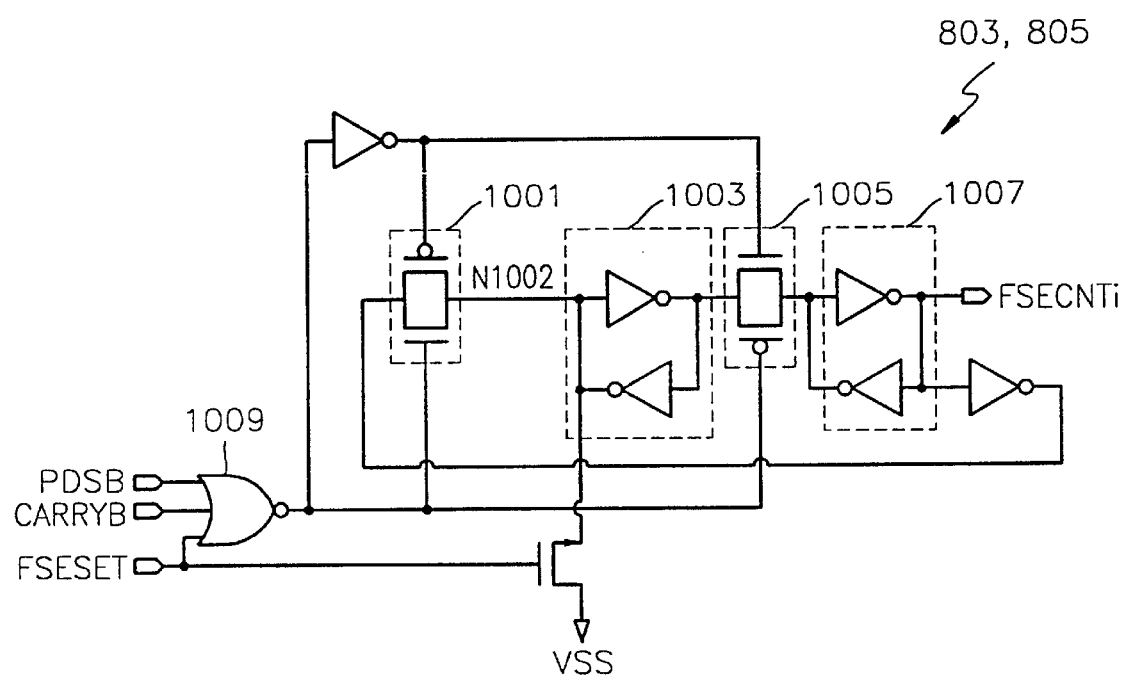
FIG. 10 is a detailed circuit diagram of one of the main counters of FIG. 8.

FIG. 10 is a detailed circuit diagram illustrating an embodiment of the main counters 803 and 805 of FIG. 8. The main counters 803 and 805 may have the same structure as shown in FIG. 10. For convenience, output signals of the main counters 803 and 805, i.e., second and third counting signals FSECNT1~2, are indicated by a counting signal FSECNTi.

A main counter has a structure and operation similar to those of the preliminary counter 807 of FIG. 9. However, a NOR gate 1009 with three input terminals is used, to which a reset signal FSESET, an inverted signal PDSB and a carry CARRYB are provided. Thus, when the reset signal FSESET and the carry CARRYB are low, the main counter is enabled in response to a phase transition of the inverted signal PDSB. That is, when the reset signal FSESET and the carry CARRYB are low, the counting signal FSECNTi repeats the phase transition whenever the inverted signal PDSB is deactivated.

Figure 11:
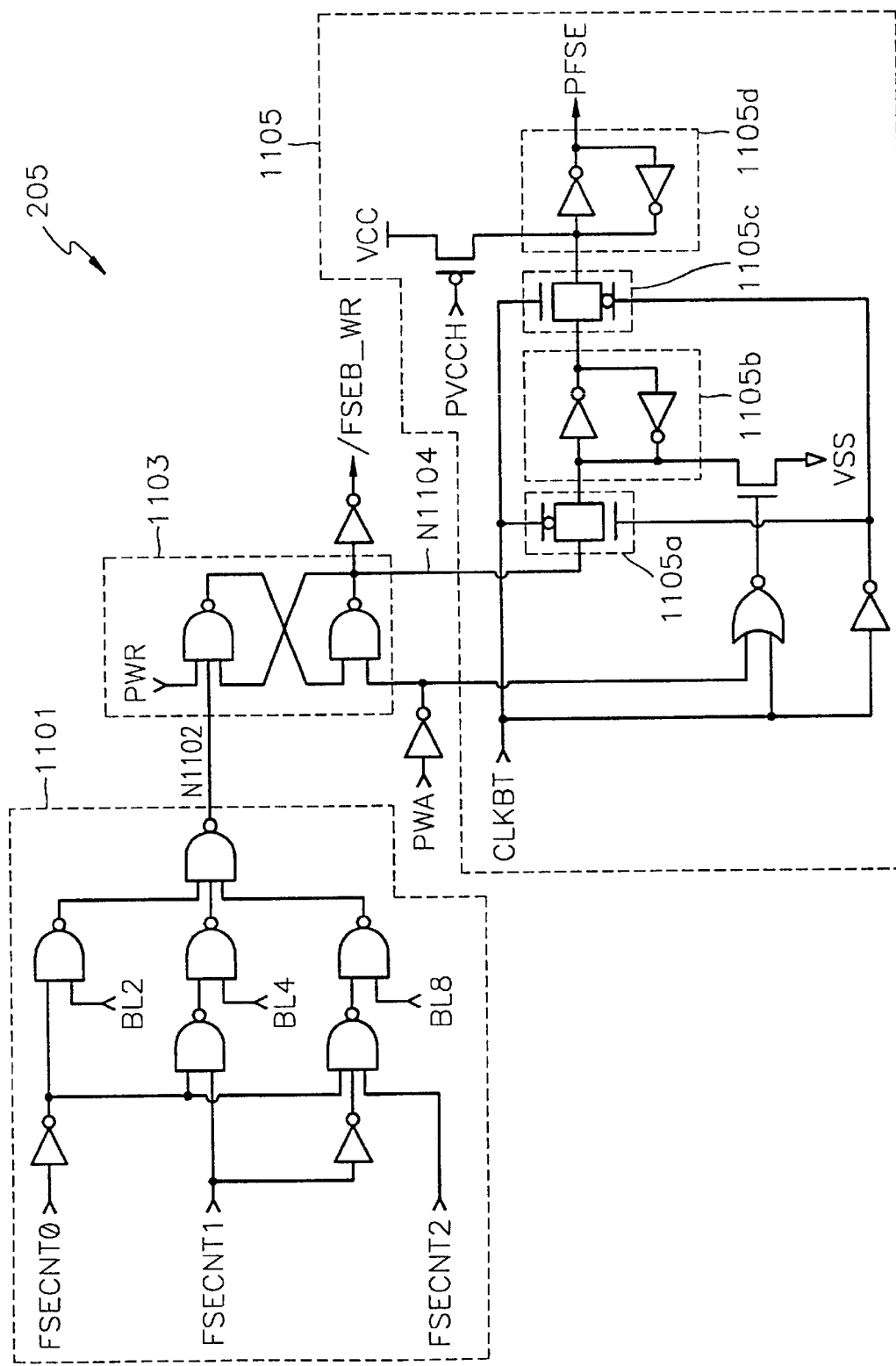
FIG. 11 is a circuit diagram of the write control unit of FIG. 2.

FIG. 11 is a detailed circuit diagram illustrating an embodiment of the write control unit 205 of FIG. 2. Referring to FIG. 11, the write control unit 205 includes a counting response unit 1101, a latch unit 1103 and a counter control signal generation unit 1105. The counting response unit 1101 indicates a data burst of input data. That is, a phase of an output signal N1102 is transited when a predetermined number of data is input.

When the first write command signal PWA is activated to high, the latch unit 1103 is enabled to respond to the output signal N1102 of the counting response unit 1101. When the second write command signal PWR becomes high, an output signal N1104 of the latch unit 1103 is latched to high. At this time, a write control signal /FSEB_WR connected to an output terminal inverting the output signal N1104 of the latch unit 1103 is activated to low. When the first write command signal PWA becomes low, the output signal N1104 of the latch unit 1103 is maintained at high. When the second write command signal PWR is high and the predetermined number of data is input so that the output signal N1102 of the counting response unit 1101 is transited to low, the output signal N1104 of the latch unit 1103 becomes low, and the write control signal /FSEB_WR is deactivated to high.

The counter control signal generation unit 1105 includes first and second transfer units 1105a and 1105 and first and second latches 1105b and 1105d. The first transfer unit 1105a transfers the output signal N1104 of the latch unit 1103 in response to a falling edge of an inverted clock signal CLKBT. The first latch unit 1105b latches a signal transferred by the first transfer unit 1105a. The second transfer unit 1105c transfers an output signal of the first latch 1105b in response to a rising edge of the inverted clock signal CLKBT. Also, the second latch 1105d latches a signal transferred by the second transfer unit 1105c, and generates a counter control signal PFSE. Here, the inverted clock signal CLKBT is an inverted signal of an external clock signal CLK.

Figure 12:
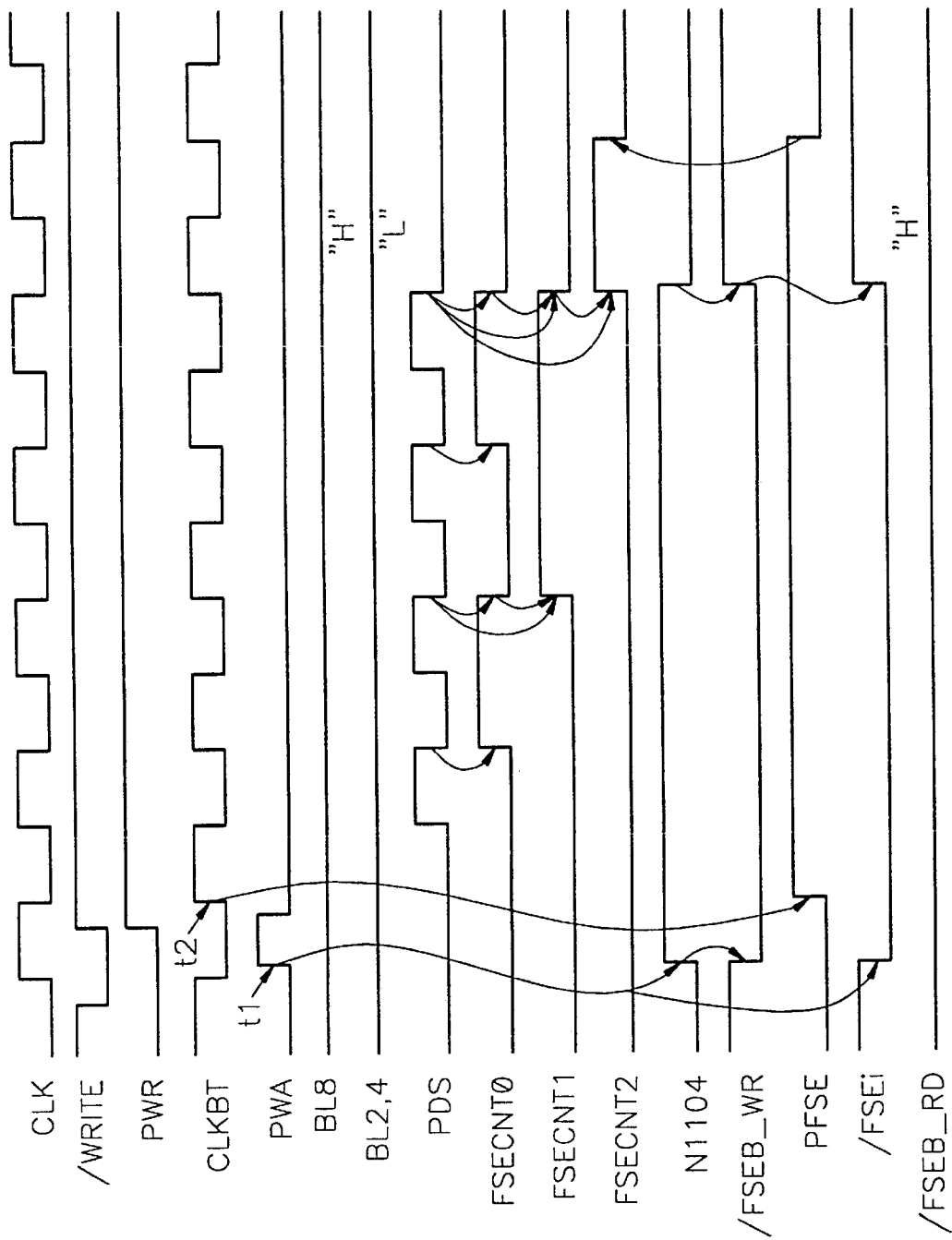
FIG. 12 is a timing diagram of control and data signals related to the burst counter of FIG. 2.

FIG. 12 is a timing diagram of signals related to the burst counter illustrated in FIGS. 2 and 8 through 11 in a write mode. FIG. 12 shows a case of a data burst of 8 in a DDR mode. Operation of the write control unit 205, the burst counter 207, the preliminary counter 807 and the main counters 803 and 805 of the burst counter 207 will be described with reference to FIG. 12.

The data burst is 8, that is, burst signal BL8 is high and burst signals BL2 and BL4 are low. The DDR mode indicates that data is input in every phase transition of the data strobe signal PDS. When the first write command signal PWA becomes high (t1), the output signal N104 of the latch unit 1103 is latched to high, and the write control signal /FSEB_WR is activated to low. When the second write command signal PWR is activated to high and activation and deactivation of the data strobe signal PDS are performed four times, i.e., 8 data are input, both the first and second counting signals FSECNT0~1 become low and the third counting signal FSECNT2 becomes high. At this time, the phase of the output signal N1102 of the counting response unit 1101 is transited to low from high, and the output signal N1104 of the latch unit 1103 becomes low. The write control signal /FSEB_WR is deactivated to high. The counter control signal PFSE is deactivated to low in response to a rising edge of the inverted clock signal CLKBT. The preliminary counter 807 and the main counters 803 and 805 are reset, so that the first through third counting signals FSECNT0~2 become low.

Referring to FIG. 4 again, a connection control signal /FSEi is activated and deactivated in response to the write control signal /FSEB_WR in a write mode. During the write mode the read control signal /FSEB_RD is deactivated to high.

Figure 13:
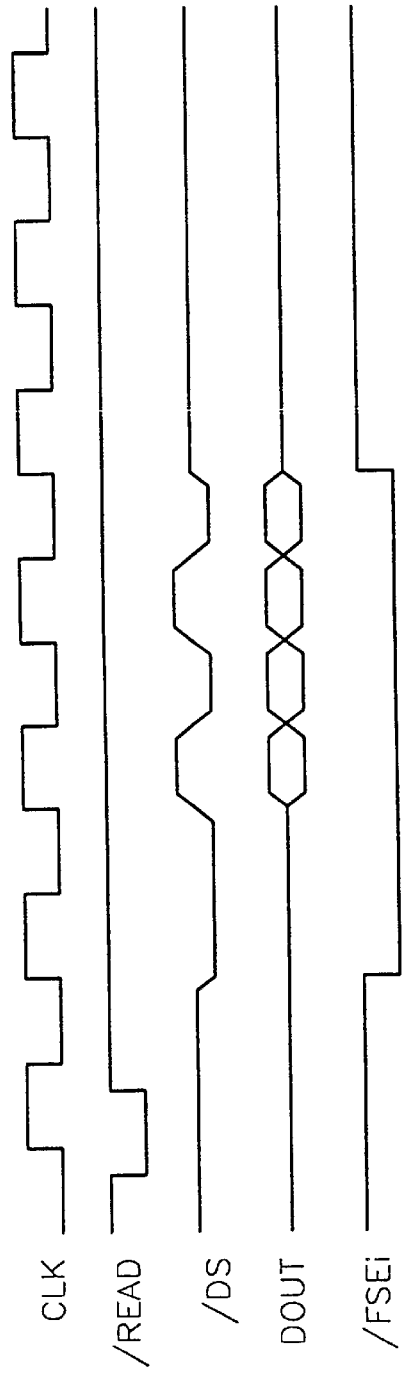
FIG. 13 is a timing diagram of external signals of memory modules in a read mode of a DDR mode in a system of the present invention.

FIG. 13 is a timing diagram of external signals of memory modules when reading data in a DDR mode in a system of the present invention. Referring to FIG. 13, the CAS latency is 2, and the burst length is 4. When a predetermined preamble interval, i.e., 1 clock cycle, passes after a read command is input, i.e., a signal /READ is activated, an external data strobe signal /DS is activated to low. The connection control signal /FSEi is also enabled to low, so that switching units 121, 122 and 123 (see FIG. 1) connected to the activated memory modules are turned on. First, data are output from the memory modules, and then the output data are transferred to the data line 131 (see FIG. 1). When a postamble interval, i.e., a half clock, passes after the last data of a data burst is output, the external data strobe signal /DS becomes high impedance state. At this time, the connection control signal /FSEi of low is disabled to high, to thereby turn off the switching units 121, 122 and 123.

Figure 14:
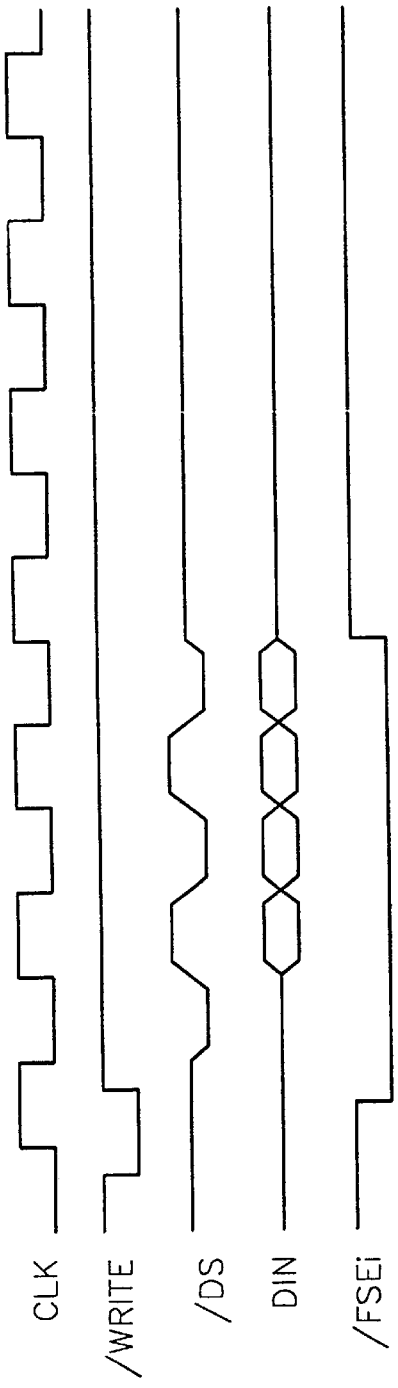
FIG. 14 is a timing diagram of external signals of memory modules in a write mode of a DDR mode in a system of the present invention.

FIG. 14 is a timing diagram of external signals of memory modules in a write mode of a DDR mode in a system of the present invention. In FIG. 14, the burst length is 4. In a ¼ clock cycle after a write command is input, i.e., a signal /WRITE is activated, the connection control signal /FSEi is enabled to low. Activated memory modules receive data corresponding to the burst length from a control unit (not shown) through the data bus line 131 (see FIG. 1). When data holding time passes after last data is received, the connection control signal /FSEi of low is disabled to high to turn off the corresponding switching units 121, 122 and 123.

As described above, a control signal generation circuit according to a preferred embodiment of the present invention generates a connection control signal activated during an interval corresponding to the burst length in which data is written in a write mode. Only the memory module selected by the connection control signal is connected to a data line during the data burst length in which data is input.

Figure 15:
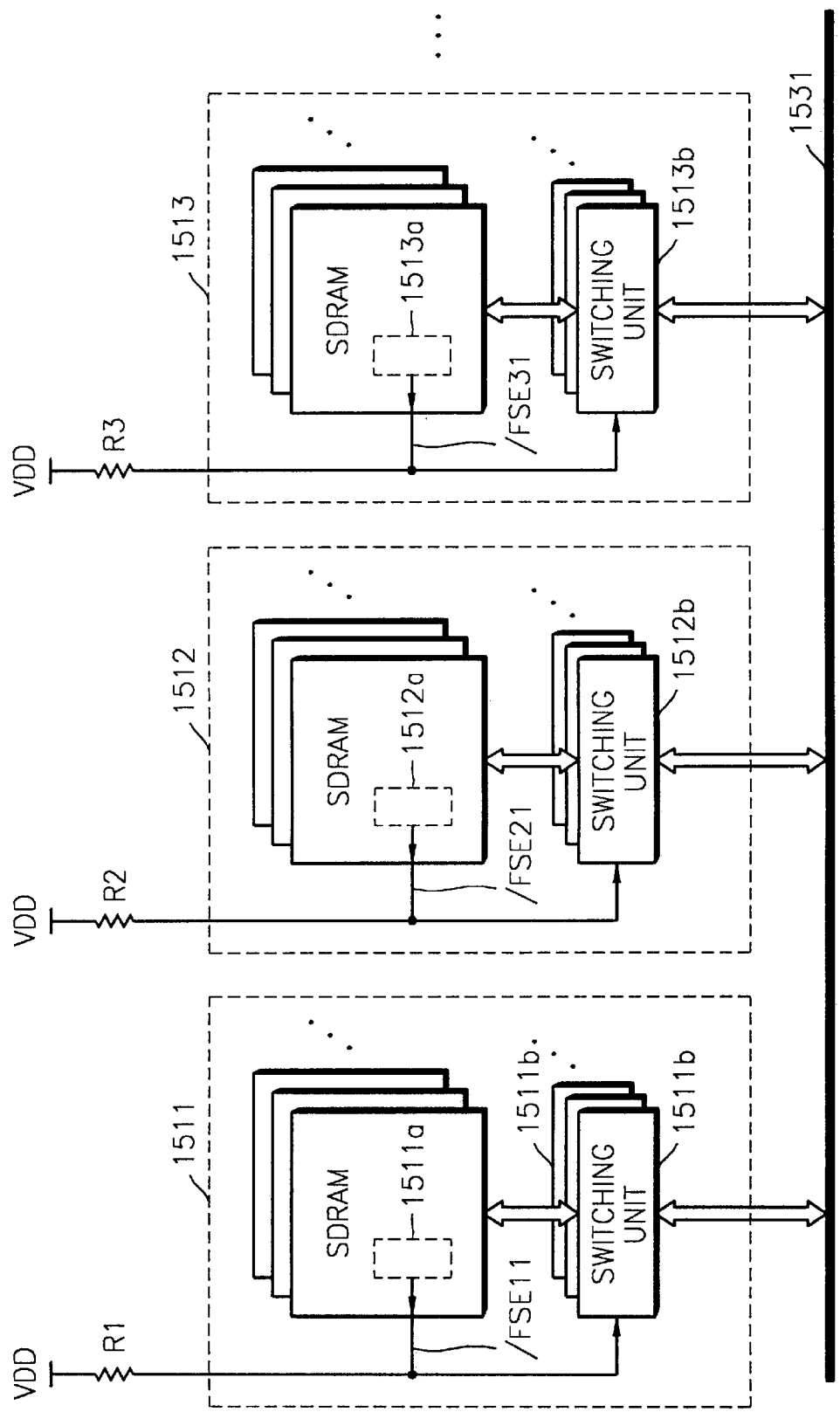
FIG. 15 is a block diagram schematically showing a system having a multiplicity of memory modules according to a second embodiment of the present invention.

FIG. 15 is a block diagram illustrating a second embodiment of the memory module system according to the present invention. Structure and operation of the memory module system according to the second embodiment are similar to those of the first embodiment. Switching units 1511b, 1512b and 1513b corresponding to the switching units 121, 122 and 123 of FIG. 1 are installed in memory modules 1511, 1512 and 1513, respectively.

As shown in FIG. 15, a multiplicity of SDRAMs (synchronous DRAMs) are installed in each of the memory modules. Also, a multiplicity of switching units each corresponding to each of the SDRAMs are installed in each of the memory modules. Connection control signals /FSE11, /FSE21 and /FSE31 controlling the switching units are generated by the SDRAMs included in the memory modules. For convenience, the connection control signals /FSE11, /FSE21 and /FSE31 are shown for controlling the switching units 1511b, 1512b and 1513b, respectively, each of which connects with a first SDRAM in a memory module. In FIG. 15, although not shown, switching units connected to other SDRAMs exist, and connection control signals for controlling the switching units are generated from the corresponding SDRAMs. A switching unit may preferably have as many switches as output terminals for outputting data from an SDRAM corresponding to the switching unit. The data output through the multiple switches are transferred to a data bus line 1531. Structure and operation of control signal generation circuits 1511a, 1512a and 1513a of the second embodiment in FIG. 15 are the same as those of the control signal generation circuits 111a, 112a and 113a of the first embodiment in FIGS. 2 through 14.

Having described preferred embodiments of a memory module system of the present invention, it is noted that modification and variations can be made by persons skilled in the art in light of the above teachings. For example, the switches which are arranged outside the SDRAM may be arranged in the SDRAM. Also, other integrated memory circuit devices such as DRAMs or SRAMs may be used instead of SDRAMs. In a DDR mode, the counter circuit of the first embodiment of the present invention counts eight data by using one preliminary counter and two main counters. However, the number of main counters may be increased to increase the number of counted data.

Also, in a memory module system of the present invention, only selected memory modules are connected to a data line during a time period of data burst length in which data is input and output, so that load per data pin is minimized and data writing and reading speed is improved.

What is claimed is:

1. A memory module system for controlling data output to a data bus, the system comprising:
    a multiplicity of memory modules each of which includes a control signal generation circuit for generating a connection control signal having a width of activation corresponding to a burst length of output data, wherein the control signal generation circuit has a read control unit for activating input data during output of data of a predetermined burst length in a read mode to generate a read control signal, the read control unit receiving CAS latency information, a read command signal and burst length information of read data; and
    a multiplicity of switching units for electrically connecting output terminals of the memory modules to the data bus in response to activation of the connection control signal;
    wherein the read control unit comprises:
        a first latency response unit for being enabled in a first CAS latency;
        a second latency response unit for being enabled in a second CAS latency;
        a first latch unit for latching one of an output signal of the first latency response unit and an output signal of the second latency response unit; and
        a first transfer unit for transferring a latched signal by the first latch unit to generate the read control signal in response to a first internal clock signal that is synchronized with a first external clock signal.

2. The memory module system of claim 1, wherein the first CAS latency is 1.5, and the second CAS latency is 2.

3. The memory module system of claim 2, wherein the connection control signal is activated in response to activation of a read strobe signal including the burst length information in case of a third CAS latency that is greater than the first and the second CAS latencies.

4. The memory module system of claim 1, wherein the first latency response unit comprises:
    a logic gate responding to activation of the first CAS latency and a read command signal; and
    a drive transistor for driving an output signal to the first latch unit in response to an output signal of the logic gate.

5. The memory module system of claim 1, wherein the second latency response unit comprises a logic gate responding to a predetermined read strobe signal which is activated during a period corresponding to the burst length of data.

6. The memory module system of claim 1, wherein the memory modules are synchronized with a second external clock signal, and the read control unit further comprises:
    a second transfer unit for transferring the output signal of the second latency response unit in response to a second internal clock signal synchronized with the second external clock signal; and
    a second latch unit for latching a signal transferred by the first transfer unit to generate the read control signal.

7. The memory module system of claim 1, wherein the connection control signal is activated by a read strobe signal including the first CAS latency and the burst length information.

8. The memory module system of claim 1, wherein the control single generation circuit further comprising a control signal generation unit for generating the connection control signal in response to activation of the read control signal output from the read control unit.

9. The memory module system of claim 8, wherein the control signal generation unit comprises:
    a logic gate responding to the read control signal; and
    a drive transistor for activating the connection control signal in accordance with the activation of the read control signal, the drive transistor being gated by an output signal of the logic gate.

10. A memory module system for controlling data output to a data bus, comprising:
    a multiplicity of memory modules; and
    a multiplicity of switching units for electrically connecting only memory module outputting data to the data bus in response to activation of a connection control signal, wherein the connection control signal is generated in the memory module outputting data and has a width of activation corresponding to a burst length of the output data;
    wherein the connection control signal, with respect to a first and a second CAS latencies, is activated in response to a CAS latency and a read command signal, and the activation is maintained by a read strobe signal including the burst length information, and the connection control signal, with respect to a third CAS latency longer than the first and the second CAS latencies, is activated in response to activation of the read strobe signal.

11. A memory module system for controlling data input from a data bus, comprising:
    a multiplicity of memory modules each of which includes a control signal generation circuit for generating a connection control signal having an activation width corresponding to a burst length of input data, wherein the control signal generation circuit includes a write information generation unit for receiving a write command signal and burst length information of write data, the write information generation unit being activated in a write mode during inputting data of a predetermined burst length to generate a write control signal; and
    a multiplicity of switches for electrically connecting input terminals of the memory modules to the data bus in response to activation of the connection control signal;
    wherein the write information generation unit comprises:
        a write control unit for receiving the write command signal and for supplying the write control signal and a counter control signal; and
        a burst counter for counting the number of external input data to supply the counted data to the write control unit, wherein the burst counter is enabled in response to activation of the counter control signal;
    wherein the write control unit comprises:
        a counting response unit for generating an output signal in response to input of data of a predetermined burst length in response to an output signal of the burst counter;

a latch unit for being enabled in response to the write command signal, for latching the output signal of the counting response unit, and for supplying the write control signal; and a counting control signal generation unit for being enabled in response to the write command signal and for inputting the write control signal to supply the counter control signal.

12. The memory module system of claim 11, wherein the memory modules are synchronized with an external clock signal, and the latch unit comprises:

a first logic gate for being enabled by a first write command signal to generate the write control signal; and a second logic gate for being enabled by a second write command signal and for responding to an output signal of the counting response unit;

wherein the data of the burst length is input, and then the write control signal is deactivated by the output signal of the counting response unit.

13. The memory module system of claim 11, wherein the counting control signal generation unit comprises:

a first transfer unit for transferring an output signal of the latch unit in response to a first transition of the external clock signal;

a first latch for latching a signal transferred by the first transfer unit;

a second transfer unit for transferring the signal latched by the first latch in response to a second transition of the external clock signal; and a second latch for latching the signal transferred by the first transfer unit to generate the counter control signal;

wherein a direction of the first transition is opposite to that of the second transition.

14. The memory module system of claim 11, wherein the control signal generation circuit further comprises a control signal generation unit for being activated in response to the write command signal, and the activation is maintained by the write control signal.

15. The memory module system of claim 14, wherein the control signal generation unit comprises:

a logic gate responding to the write information signal; and a drive transistor for activating the connection control signal in response to the activation of the write control signal, the drive transistor being gated by an output signal of the logic gate.

16. A semiconductor memory device comprising:

a multiplicity of integrated memory circuit devices including a control signal generation circuit for generating a connection control signal having an activation width corresponding to a burst length of output data, wherein the control signal generation circuit comprises a read control unit for activating input data during output of data of a predetermined burst length in a read mode to generate a read control signal, the read control unit receiving CAS latency information, a read command signal and burst length information of data to be read; and at least one switching unit for connecting output terminals of the integrated memory circuit devices where data is output and a data bus in response to activation of the connection control signal;

wherein the read control unit comprises:

a first latency response unit for being enabled in a first CAS latency;

a second latency response unit for being enabled in a second CAS latency;

a first latch unit for latching one of an output signal of the first latency response unit and an output signal of the second latency response unit; and a first transfer unit for transferring a latched signal by the first latch unit to generate the read control signal in response to a first internal clock signal that is synchronized with a first external clock signal.

17. The semiconductor memory device of claim 16, wherein the first CAS latency is 1.5, and the second CAS latency is 2.

18. The semiconductor memory device of claim 16, wherein the first latency response unit comprises:

a logic gate responding to the activation of the first CAS latency and a predetermined read command signal; and a drive transistor for driving an output signal to the first latch unit in response to an output signal of the logic gate.

19. The semiconductor memory device of claim 16, wherein the second latency response unit comprises a logic gate responding to a predetermined read strobe signal, wherein activation of the read strobe signal is maintained during a period corresponding to a burst length of minimum data.

20. The semiconductor memory device of claim 16, wherein the semiconductor memory device is synchronized with a second external clock signal, and the read control further comprises:

a second transfer unit for transferring the output signal of the second latency response unit to the first latch unit in response to a second internal clock signal synchronized with the second external clock signal; and a second latch unit for latching a signal transferred by the first transfer unit to generate the read control signal.

21. The semiconductor memory device of claim 16, wherein activation of the read control signal is maintained by a read strobe signal including the first CAS latency and the burst length information.

22. The semiconductor memory device of claim 21, wherein the read control signal, with respect to a third CAS latency longer than the first and the second CAS latencies, is activated in response to activation of the read strobe signal including the burst length information.

23. A semiconductor memory device comprising:

a multiplicity of the integrated memory circuits including at least one control signal generation circuit for generating a connection control signal having an activation width corresponding to a burst length of input data, wherein the control signal generation circuit includes a write information generation unit for receiving burst length information of write command and write data, the control signal generation circuit being activated during input of data of a predetermined burst length in a write mode to generate a write control signal; and at least one switching unit for connecting input terminals of the integrated memory circuits where data is input and a data bus in response to activation of the connection control signal;

wherein the write information generation unit comprises:

a write control unit for receiving the write command signal to supply the write control signal and a counter control signal; and a burst counter for counting the number of external input data to supply the counted data to the write control unit, wherein the burst counter is enabled in response to activation of the counter control signal;

wherein the write control unit comprises:
a counting response unit for generating an output signal responding to input of data having a predetermined burst length in response to an output signal of the burst counter;
a latch unit for being enabled in response to the write command signal to latch the output signal of the counting response unit, and for supplying the write control signal; and
a counting control signal generation unit for being enabled in response to the write command signal and for inputting the write control signal to supply the counter control signal.

24. The semiconductor memory device of claim 23, wherein the semiconductor memory device is synchronized with an external clock signal, and the latch unit comprises:
a first logic gate for being enabled by a first write command signal to generate the write control signal; and
a second logic gate for being enabled by a second write command signal to respond to an output signal of the counting response unit;
wherein the write control signal is deactivated by the output signal of the counting response unit after input of data having a predetermined burst length.

25. The semiconductor memory device of claim 23, wherein the counting control signal generation unit comprises:

a first transfer unit for transferring an output signal of the latch unit in response to a first transition of the external clock signal;
a first latch for latching a signal transferred by the first transfer unit;
a second transfer unit for transferring a signal latched by the first latch in response to a second transition of the external clock signal; and
a second latch for latching a signal transferred by the first transfer unit, to generate the counter control signal;
wherein a direction of the first transition is opposite to that of the second transition.

26. The semiconductor memory device of claim 23, wherein the control signal generation circuit further comprises a control signal generation unit for generating the connection control signal activated in response to the write command signal and for maintaining the activation in accordance with the write control signal.

27. The semiconductor memory device of claim 26, wherein the control signal generation unit comprises:
a logic gate responding to the write information signal; and
a drive transistor for activating the connection control signal in accordance with activation of the write control signal, the drive transistor being gated by an output signal by the logic gate.

* * * * *